United States Patent [19]

Steele et al.

[11] Patent Number: 5,386,155

[45] Date of Patent: Jan. 31, 1995

[54] APPARATUS AND METHOD FOR SELECTING POLARITY AND OUTPUT TYPE IN A PROGRAMMABLE LOGIC DEVICE

[75] Inventors: Randy C. Steele, Folsom; Mike Allen, Rescue, both of Calif.

[73] Assignee: Intel Corporation, Santa Clara, Calif.

[21] Appl. No.: 39,899

[22] Filed: Mar. 30, 1993

[51] Int. Cl.$^6$ .................................. H03K 19/177
[52] U.S. Cl. .................................. 326/37; 326/82
[58] Field of Search .................... 365/189.05, 191; 307/451, 443, 465

[56] References Cited

U.S. PATENT DOCUMENTS

| | | | |
|---|---|---|---|
| 4,789,951 | 12/1988 | Birkner et al. | 307/465 |
| 4,894,563 | 1/1990 | Gudger | 307/465 |
| 4,914,322 | 4/1990 | Win et al. | 307/465 |
| 5,023,485 | 1/1991 | Sweeney | 307/465 |
| 5,027,315 | 1/1991 | Agrawal et al. | 307/465 X |

FOREIGN PATENT DOCUMENTS

| | | | |
|---|---|---|---|
| 0512536 | 11/1992 | European Pat. Off. | 307/465 |
| 0060314 | 3/1987 | Japan | 307/465 |

*Primary Examiner*—Eugene R. LaRoche
*Assistant Examiner*—Son Dinh
*Attorney, Agent, or Firm*—Blakely, Sokoloff, Taylor & Zafman

[57] ABSTRACT

A specialized output buffer circuit which obviates the need to utilize a separate multiplexer to determine polarity selection and output type selection in a programmable logic device is disclosed. In accordance with the present invention, these determinations are made in a specialized output buffer circuit. A sum of product term, a complement of the sum of product term, a registered version of the sum of product term, and a complement of the registered version of the sum of product term, are coupled directly to the output buffer circuit, wherein one of these signals is selected and coupled to an output pin.

9 Claims, 8 Drawing Sheets

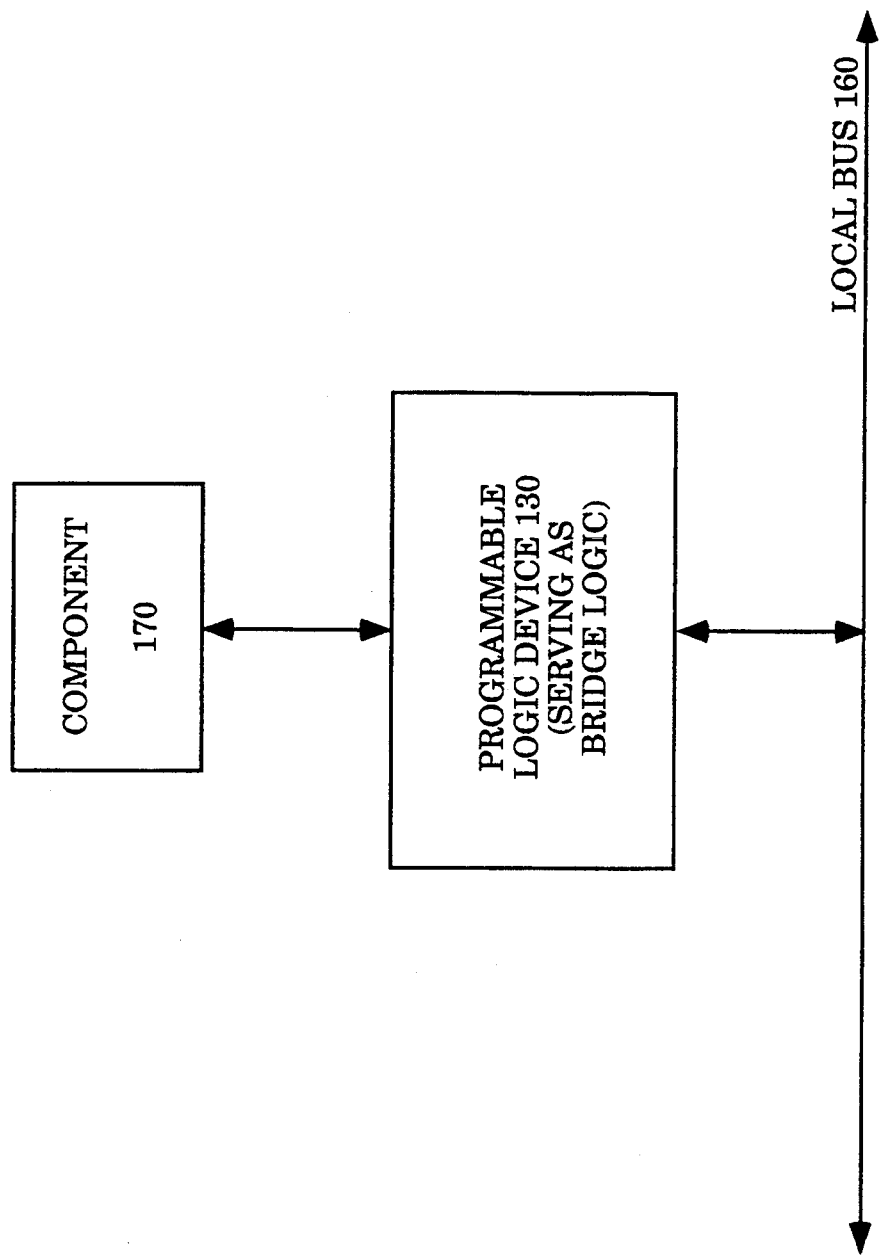

APPARATUS AND METHOD FOR SELECTING POLARITY AND OUTPUT TYPE IN A PROGRAMMABLE LOGIC DEVICE

BACKGROUND OF THE INVENTION

1. Field of the Invention

The present invention relates to programmable logic devices, and more particularly, to an apparatus and method which provides for the selection of output type and polarity in a programmable logic device which minimizes any resulting increase in the propagation time of the logic.

2. Art Background

Most programmable logic devices (PLD's) are internally structured as variations on an architecture which utilizes a programmable logic array. A programmable logic array makes use of the fact that any logic equation can be converted into an equivalent "sum-of-products" form and thus implemented through the use of interconnected "AND" and "OR" gates. A programmable logic device (PLD) incorporating this architecture provides the user of the PLD with the ability to programmably determine the inputs into an array of "AND" gates connected to an array of "OR" gates, and thereby, programmably determine a number of sum of product terms.

Programmable logic devices (PLD's) typically provide the user of the PLD with a number of options with respect to each sum of product term generated by the PLD. For example, a PLD frequently provides for the option of feedback wherein selected sum of product terms can be coupled back into the programmable logic. In addition, a PLD also frequently provides for the ability to output the complement of a sum of product, or a registered version of a sum of product such that sequential logic can be programmed. Providing for these output options, however, tends to disadvantageously add to the overall propagation time of the logic due to the addition of further stages of circuitry. As will be described, the apparatus and method of the present invention advantageously provides for output type and polarity selection in a PLD, while minimizing any addition to the overall propagation time of the logic.

SUMMARY OF THE INVENTION

The present invention finds application in the area of programmable logic devices. In accordance with the present invention, a programmable logic device incorporates a specialized output buffer circuit which obviates the need to utilize a separate multiplexer to determine polarity and output type selection. These determinations are, instead, made in conjunction with the output buffer circuit. This output buffer circuit advantageously comprises four N-channel transistors serially connected together, which are then selectively coupled to a circuit comprising a first P-channel transistor, two N-channel transistors, and a second P-channel transistor serially connected. A sum of product term, a complement of the sum of product term, a registered version of the sum of product term, and a complement of the registered version, are then coupled directly to the output buffer circuit.

In accordance with the present invention, the selection between a combinatorial output (sum of product) and a sequential output (registered version of the sum of product) is determined directly by which of these signal types is enabled, and which of these signal types is disabled, when coupled to the output buffer. The selection of polarity is accomplished through the use of a polarity select line which is coupled to the output buffer circuit. The polarity select line determines whether the true or complement of the sequential or combinatorial output is passed to the output pin. By placing output type and polarity selection in the output buffer, the present invention minimizes the increase to the propagation time of the logic.

BRIEF DESCRIPTION OF THE DRAWINGS

Further details are explained below with the help of the examples illustrated in the attached drawings in which:

FIG. 8 illustrates the use of the programmable logic devices as a bridge between a component and a local bus.

DETAILED DESCRIPTION OF THE INVENTION

An apparatus and method for selecting output type and polarity in a PLD which minimizes any resulting increase in logic propagation time is described. In the following description, for purposes of explanation, numerous details are set forth in order to provide a thorough understanding of the present invention. However, it will be apparent to one skilled in the art that such specific details are not essential to the practice of the present invention. In other instances, in a number of figures, well known electrical structures and circuits are shown in block diagram form in order not to obscure the present invention unnecessarily. In the description which follows, the present invention will be described with reference to a particular programmable logic device (PLD), and in particular, with reference to a specific field programmable gate array (FPGA). It will be appreciated by one skilled in the art, however, that the present invention is in no way limited to this specific field programmable gate array (FPGA), but is instead, readily applicable to virtually any device with programmable outputs.

Figure 1:
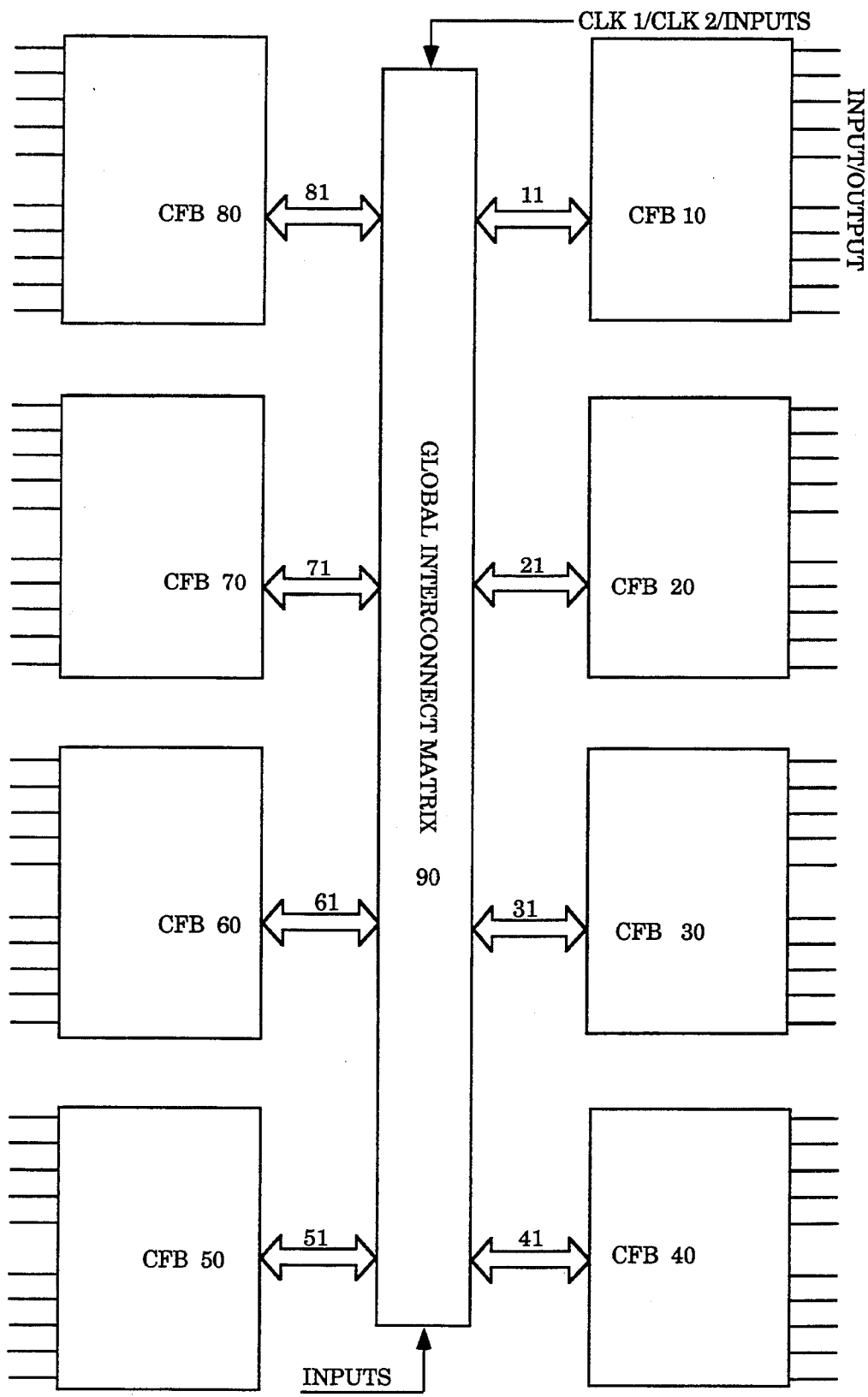
FIG. 1 illustrates, in block diagram form, the overall architecture of a field programmable gate array in which the present invention can be utilized.

Referring now to FIG. 1, this figure illustrates, in block diagram form, the overall architecture of a field programmable gate array (FPGA) in which the present invention can be utilized. This field programmable gate array (FPGA) is described in detail in copending U.S. patent application Ser. No. 08/039,972, entitled "Field Programmable Gate Array With High Speed SRAM Based Configurable Function Block Configurable As High Performance Logic Or Block Of SRAM," filed on Mar. 30, 1993. As shown in FIG. 1, the field programmable gate array (FPGA) chip 100 is comprised of eight configurable function blocks (CFB's) 10, 20, 30, 40, 50, 60, 70, and 80, coupled to a global interconnect matrix 90. In particular, configurable function blocks (CFB's) 10, 20, 30, 40, 50, 60, 70, and 80, are coupled to global interconnect matrix 90, with associated buses 11, 21, 31, 41, 51, 61, 71, and 81, respectively. In the embodiment illustrated in FIG. 1, each CFB has ten outputs, each of which is coupled to an output pin of FPGA chip 100. Global interconnect matrix 90 is comprised of buffering logic and switches that selectively couple specified signals to particular CFB's. Global interconnect matrix 90 is fully connectable to any pin of FPGA chip 100. Thus, the INPUTS of global interconnect matrix 90 include any of the CFB outputs, thereby providing for feedback between the CFB's (feedback lines not shown).

Continuing to refer to FIG. 1, as described in greater detail in the above referenced copending U.S. application, each configurable function block (CFB) can be configured by the user of FPGA chip 100 as either high performance programmable logic or a block of SRAM. Thus, the user of FPGA chip 100 has the choice of operating each CFB in at least two different modes. In a first mode referred to as "logic mode," the user configures and operates the CFB as high performance programmable logic. When a CFB is configured by a user to operate in logic mode, the CFB is programmable like a programmable logic device (PLD), allowing the user to implement a substantial number of Boolean equations on a substantial number of input signals. Thus, in logic mode, a CFB can be compared to a separate programmable logic device (PLD) that can be programmed to execute logic equations by the user of FPGA chip 100. In a second, alternative mode, termed "memory mode," the user configures and operates the CFB as a block of SRAM. This block of SRAM can then be read from and written to in accordance with standard SRAM commands.

Figure 2:
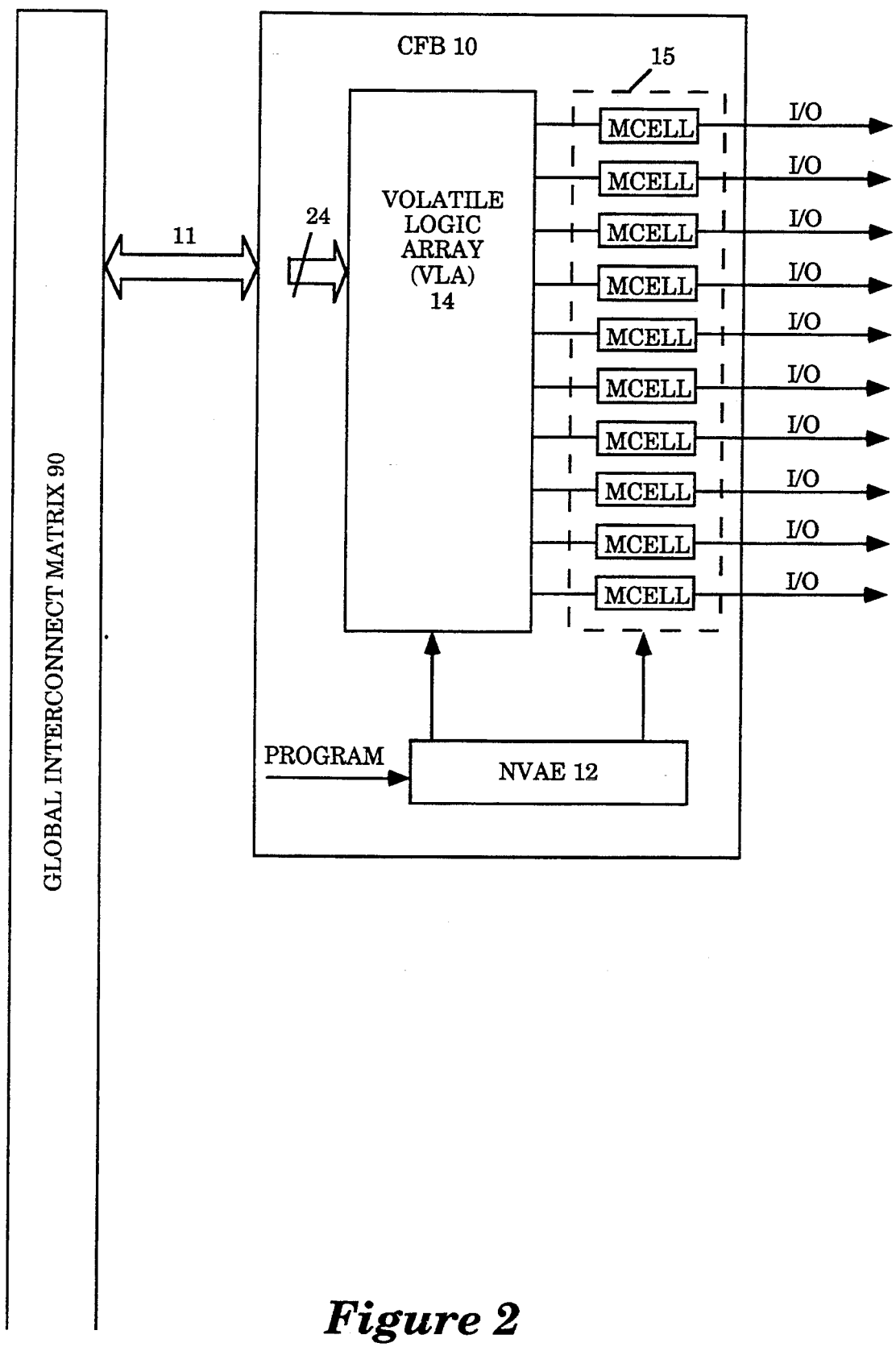
FIG. 2 illustrates, in block diagram, the composition of an exemplary configurable function block in the field programmable gate array.

Referring now to FIG. 2, this figure illustrates, in block diagram, the composition of exemplary CFB 10 which is similar in composition to the other CFB's. As shown, CFB 10 comprises three general blocks: a non-volatile architectural element (NVAE) 12, a volatile logic array (VLA) 14, and macrocell circuitry 15. Non-volatile architectural element (NVAE) 12 is comprised of, for example, erasable programmable read only memory (EPROM) or electrically erasable programmable read only memory (EEPROM). In contrast, volatile logic array (VLA) 14 is comprised of an array of "AND" gates connected to an array of "OR" gates with programmable connections (not shown in this figure). The programmable connections in volatile logic array (VLA) 14 comprise volatile memory cells, for example, static random access memory (SRAM) cells. Macrocell circuitry 15 comprises circuitry, including registers, which provides for the output of signals from the volatile logic array 14, as well as feedback to the global interconnect matrix 90.

If the user of FPGA chip 100 wants CFB 10 to serve as high performance programmable logic, the user initially programs the desired logic equations into CFB 10. In accordance with a first programming method, the actual architectural configuration corresponding to these desired logic equations is initially programmed into non-volatile architectural element (NVAE) 12. In contrast to certain prior art systems, the non-volatile memory in non-volatile architectural element (NVAE) 12 is not, thereafter, in the "speed path" when the desired logic equations in CFB 10 are eventually performed. Thus, for example, when CFB 10 ultimately performs the desired logical equations, the EPROM in non-volatile architectural element (NVAE) 12 is not repeatedly referenced in the performance of the desired logic equations in CFB 10.

Instead, after FPGA chip 100 has been programmed by the user, and is thereafter switched on for use, the configuration corresponding to the desired logic equations programmed into non-volatile architectural element 12 is transferred into volatile memory cells (e.g. SRAM) in volatile logic array (VLA) 14. It is these volatile memory cells in volatile logic array (VLA) 14 which are then used directly in the logic path when performing the desired logic equations in CFB 10. As described earlier, it is these volatile memory cells which serve as the "programmable" connections in volatile logic array (VLA) 14. The programmability of FPGA chip 100 extends to the macrocell circuitry 15 which also receives configuration bits from non-volatile architectural element (NVAE) 12 on power up. In particular, each macrocell in macrocell circuitry 15 can be configured as either a fast combinatorial block without registering of the output, or sequential logic using a D-register, or a Toggle flip-flop.

In a second, alternative process of programming configurable function block (CFB) 10, the user of FPGA chip 100 programs the desired logic equations directly into the SRAM cells in volatile logic array (VLA) 14 and macrocell circuitry 15. The desired configuration, now stored in the SRAM cells of volatile logic array (VLA) 14 and macrocell circuitry 15, is then used to execute the desired logic operations.

Figure 3:
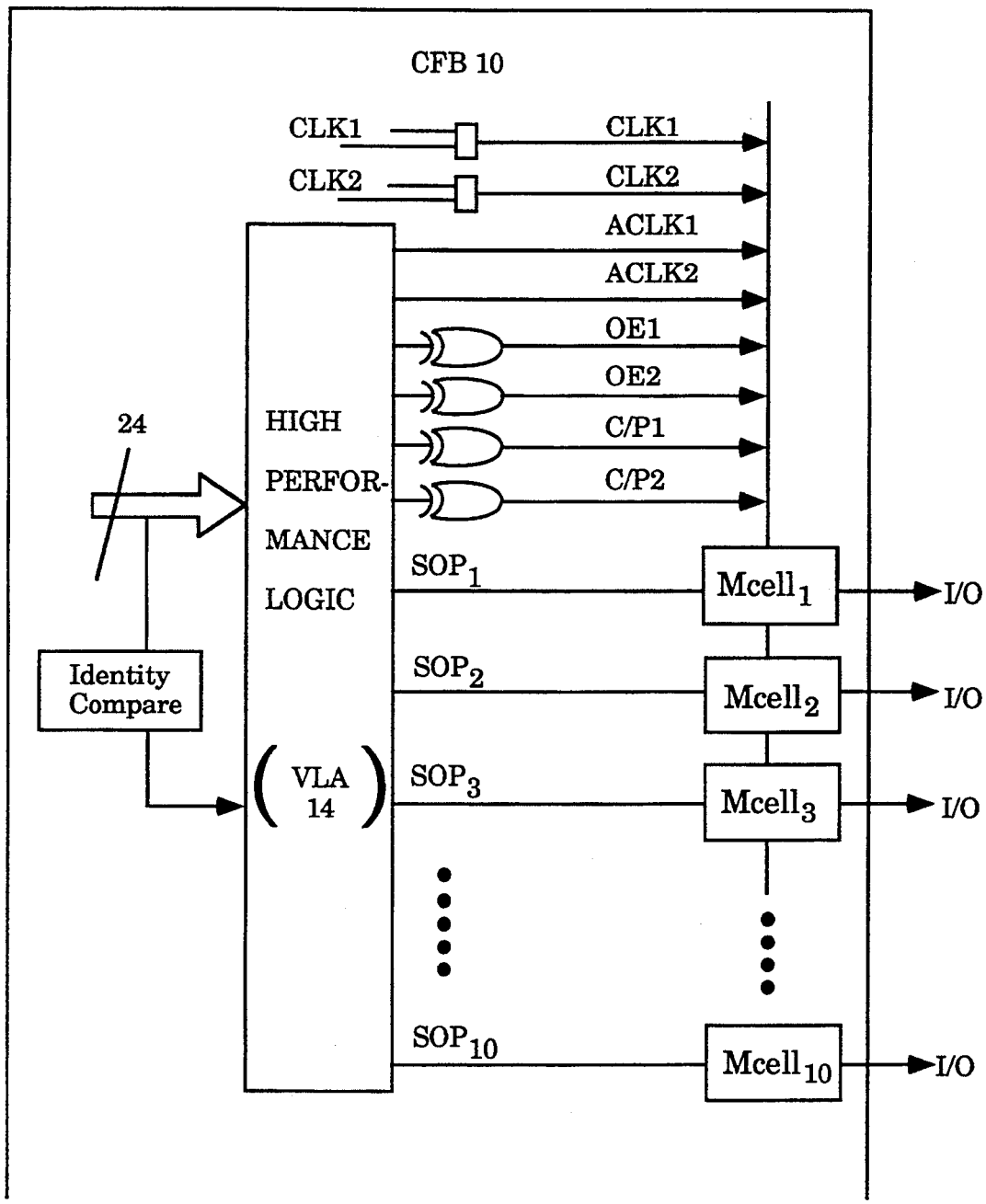
FIG. 3 illustrates the exemplary configurable function block when configured to operate in logic mode.

With reference now to FIG. 3, this figure illustrates CFB 10 when configured to operate in logic mode. When CFB 10 is configured by the user to operate in logic mode, volatile logic array 14 functions as high performance programmable logic. In operation, global interconnect matrix 90 selectively couples the desired input signals over bus 11 to the volatile logic array 14, which then performs the desired logical operations on the input signals.

In the embodiment shown in FIG. 3, up to twenty four input signals can be input into the block. Following the performance of the desired logical operations, up to ten sum of product terms ($SOP_1$–$SOP_{10}$) are coupled to up to ten macrocells ($Mcell_1$–$Mcell_{10}$). The sum of product terms are then coupled from the macrocells to the pin outs of the FPGA chip 100. Two global clock signals, CLK1 and CLK2, are available to clock the macrocells. Two asynchronous clock signals ACLK1 and ACLK2 are generated locally within volatile logic array (VLA) 14 and are also available to clock the macrocells. The control signals OE1, OE2, C/P1, and C/P2, are also generated within volatile logic array 14 and serve as control signals for the macrocells. In addition, an Identity Compare Block is provided, and is described in greater detail in copending U.S. patent application Ser. No. 08/039,899, filed Feb. 16, 1993, entitled High speed comparative logic for wide compare in programmable logic device.

Figure 4:
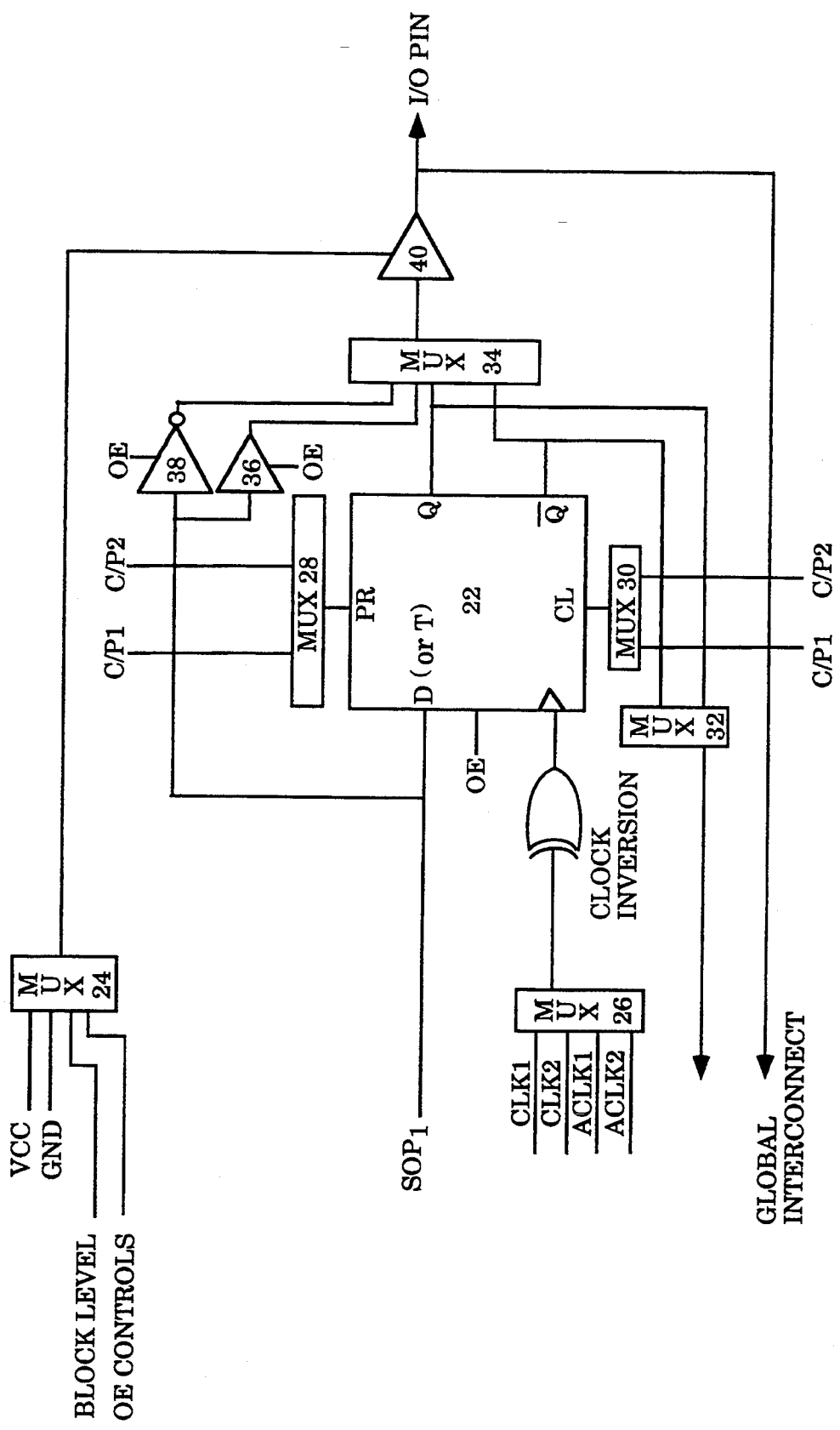
FIG. 4 illustrates the functional detail of a single macrocell, $Mcell_1$.

Referring now to FIG. 4, this figure illustrates the functional detail of a single macrocell, $Mcell_1$, which is similar in design to the other macrocells. As illustrated, $Mcell_1$ comprises a register 22 (configurable as either a D-register or a Toggle flip-flop), multiplexers 24, 26, 28, 30, 32, 34, driver 36, inverter 38, and output buffer 40. As shown, the preset and clear inputs to register 22 receive multiplexed control signals. Accordingly, control signal Clear/Preset 1 (C/P1), and control signal Clear/Preset 2 (C/P2), are coupled to the inputs of multiplexer 28, the output of which is then coupled to the preset input of register 22. Similarly, C/P1 and C/P2 are coupled to the inputs of multiplexer 30, the output of which is coupled to the clear input of register 22. The user of the FPGA is thereby able to programmably choose whether to couple C/P1 or C/P2 to either the clear or preset inputs of register 22. Accordingly, individual registers in the programmable logic device can be selectively preset or cleared through the use of this design. The flexibility offered by this design contrasts to prior art designs used in PLD's wherein a single clear signal is coupled to all clear inputs on all registers, and a single preset signal is coupled to all preset inputs on all registers.

Continuing to refer to FIG. 4, as shown, a Sum Of Product term ($SOP_1$) is shown coupled to the inputs of register 22, driver 36, and inverter 38, all of which have output enables such that architectural bits from non-volatile architectural element (NVAE) 12 (not shown in this figure) determine whether each one of these will be enabled or tri-stated into a disabled status. As shown, the outputs of driver 36 and inverter 38 are coupled to multiplexer 34. Similarly, the registered output of register 22, and the complement of the registered output of register 22, are also coupled to multiplexer 34. Multiplexer 34 is thereby used to select one of four possible outputs to be coupled to output buffer 40. These include: the sum of product term itself ($SOP_1$), the complement of $SOP_1$, a registered version of $SOP_1$, or a complement of the registered version of $SOP_1$. Following the selection of the desired output at multiplexer 34, the desired output is coupled to output buffer 40, which then couples the desired output to the pin of the chip. Accordingly, four possible outputs are provided for each sum of product term.

Continuing to refer to FIG. 4, it will be appreciated that the use of the multiplexer 34 in the "speed path" adds to the overall propagation time of the logic, namely, the amount of time it takes from the point in time at which a signal is input into the logic, to the point in time at which an output signal is output. It will be appreciated, for example, that if four output options were not provided for, but instead, only a single output option ($SOP_1$) were available to the user, multiplexer 34 would not have to be incorporated, and the single output option would simply be coupled directly to output buffer 38. Thus, providing for polarity selection, as well as the choice between an output type appropriate for sequential logic or an output type appropriate for combinatorial logic exacts a price in terms of speed. As will be described, in accordance with the present invention, polarity selection and output type selection are advantageously provided for in a specialized output buffer circuit.

Figure 5:
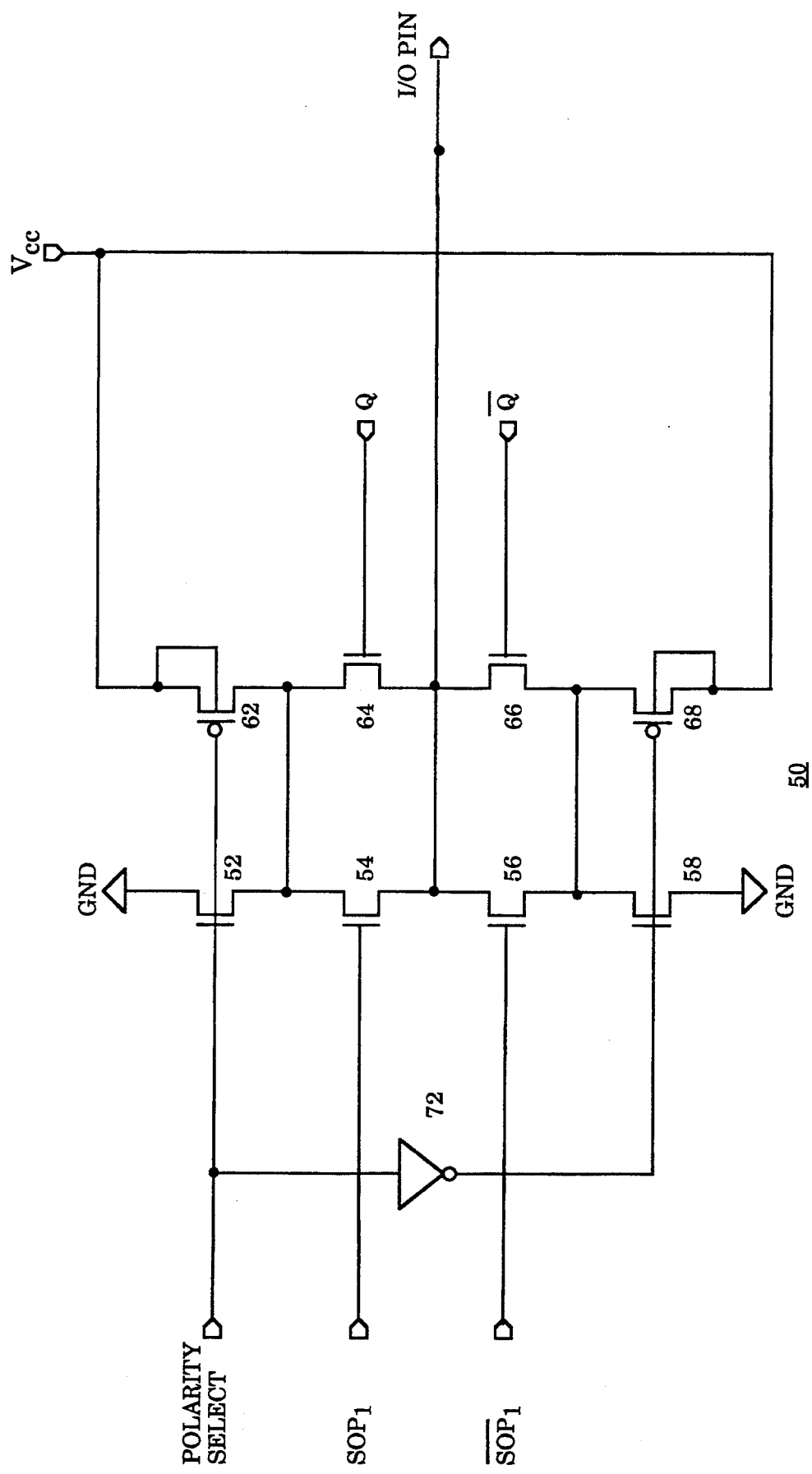
FIG. 5 illustrates the programmable logic device output buffer circuit of the present invention.

With reference now to FIG. 5, this figure illustrates the output buffer circuit 50 of the present invention. More particularly, this figure illustrates the construction of an output buffer circuit 50 which obviates the need to utilize a separate multiplexer to determine polarity selection and output type selection in a programmable logic device. As shown, the output buffer circuit 50 comprises N-channel MOSFET transistors 52, 54, 56, 58, 64, and 66, P-channel MOSFET transistors 62 and 68, and inverter 72. More particularly, N-channel MOSFET transistors 52, 54, 56, and 58 are serially connected such that: the source of transistor 52 is coupled to ground, while the drain of transistor 52 is coupled to the source of transistor 54; the drains of transistors 54 and 56 are coupled together, while the source of transistor 56 is coupled to the drain of transistor 58, and the source of transistor 58 is coupled to ground. As illustrated, the sum of product, $SOP_1$, is then coupled to the gate of transistor 54, while the complement of $SOP_1$ is coupled to the gate of transistor 56.

Continuing to refer to FIG. 5, P-channel transistor 62, N-channel transistor 64, N-channel transistor 66, and P-channel transistor 68, are also serially connected such that: the source of transistor 62 is coupled to $V_{cc}$ while the drain of transistor 62 is coupled to the drain of transistor 64; the sources of transistors 64 and 66 are coupled together, while the drain of transistor 66 is coupled to the drain of transistor 68, and the source of transistor 68 is coupled to $V_{cc}$. Also as illustrated, the registered output, Q, is coupled to the gate of transistor 64, and the complement of Q is coupled to the gate of transistor 66. In can further be noted from FIG. 5 that: the drain of transistor 62 and the drain of transistor 64 are coupled to the drain of transistor 52 and the source of transistor 54; the drain of transistor 66 and the drain of transistor 68 are coupled to the source of transistor 56 and the drain of transistor 58; and the drains of transistors 54 and 56 are coupled to the sources of transistors 64 and 66. The output of the output buffer circuit is then taken at the couplings between the drains of transistors 54 and 56 and the sources of transistors 64 and 66.

In operation, the selection between a combinatorial output ($SOP_1$, or the complement of $SOP_1$) and a sequential output (Q, or the complement of Q) is determined directly by which of these output types is enabled and which of these output types is disabled. Returning to FIG. 4, it will be recalled that both driver 36, inverter 38, and register 22 are either programmably enabled or disabled by the user of the chip. Accordingly, if the user desires a combinatorial output, register 22 is disabled and tri-stated. With reference to FIG. 5, this condition results in transistors 64 and 66 being turned off, thereby causing either $SOP_1$ or the complement of $SOP_1$ to be coupled to the output pin. Referring again to FIG. 4, if the user desires a sequential output, driver 36 and inverter 38 are disabled and tri-stated. With reference to FIG. 5, this condition results in transistors 54 and 56 being turned off, thereby causing either Q or the complement of Q to coupled to the output pin.

The selection of polarity is accomplished through the selective use of a polarity select line which is shown in FIG. 5. As illustrated, the polarity select line is coupled to the gates of transistors 52 and 72, inverted through inverter 62, and coupled to the gates of transistors 58 and 68. Accordingly, the state of the polarity select line determines whether the true or complement of the sequential or combinatorial output is coupled to the I/O pin.

Figure 6:
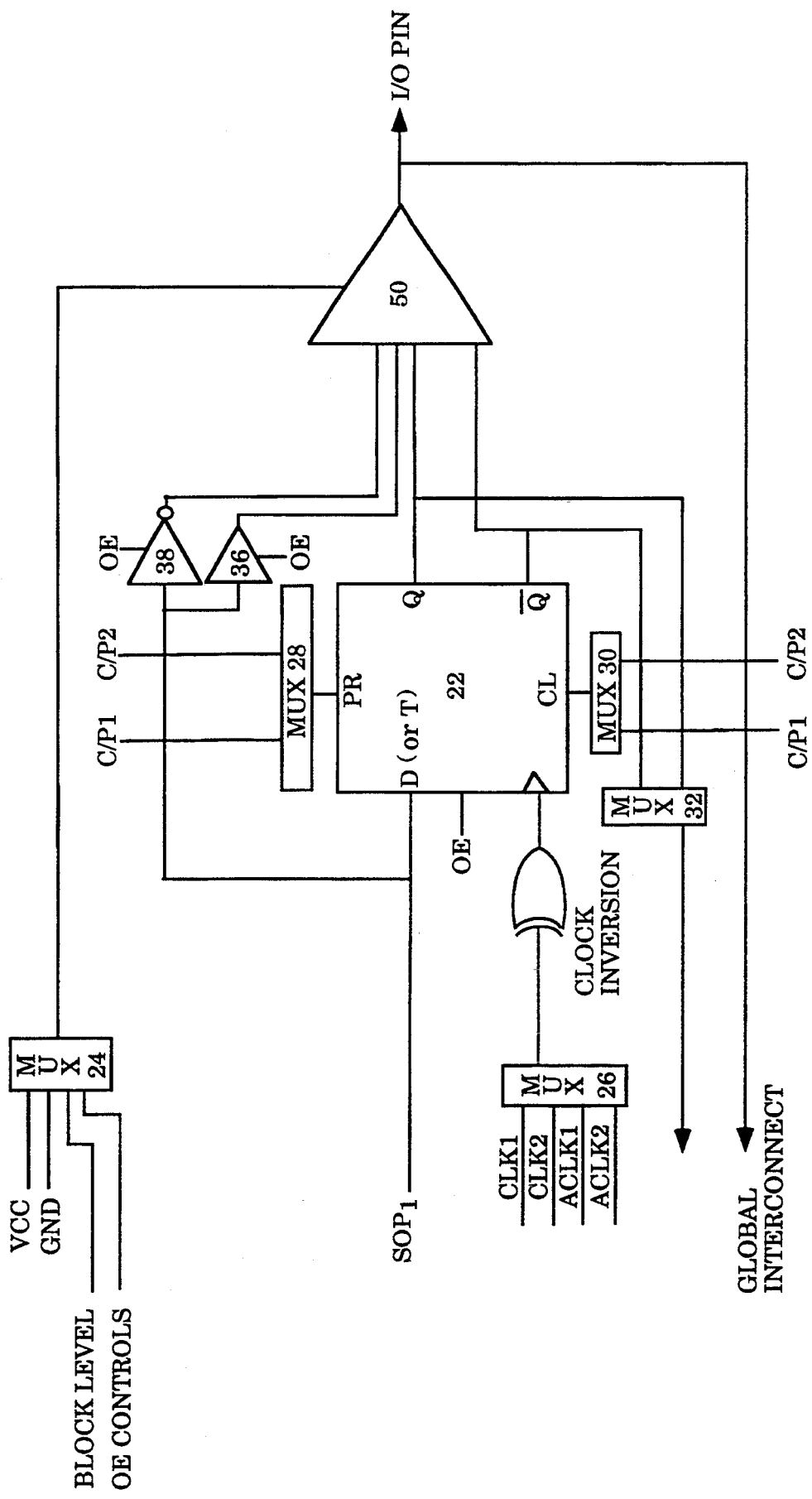
FIG. 6 illustrates the placement of the output buffer circuit of the present invention within a macrocell circuit.

Referring to FIG. 6, the placement of output buffer 50 within the macrocell circuit is shown. Comparing FIG. 6 to FIG. 4, it will be appreciated that the output buffer 50 is placed in the position formerly occupied by output buffer 40, and the multiplexer circuit 34 has been removed. It will thus be appreciated that the apparatus and method of the present invention provides for output type and polarity selection through the use of a specialized output buffer circuit, thereby minimizing the cost in increased propagation time.

Figure 7:
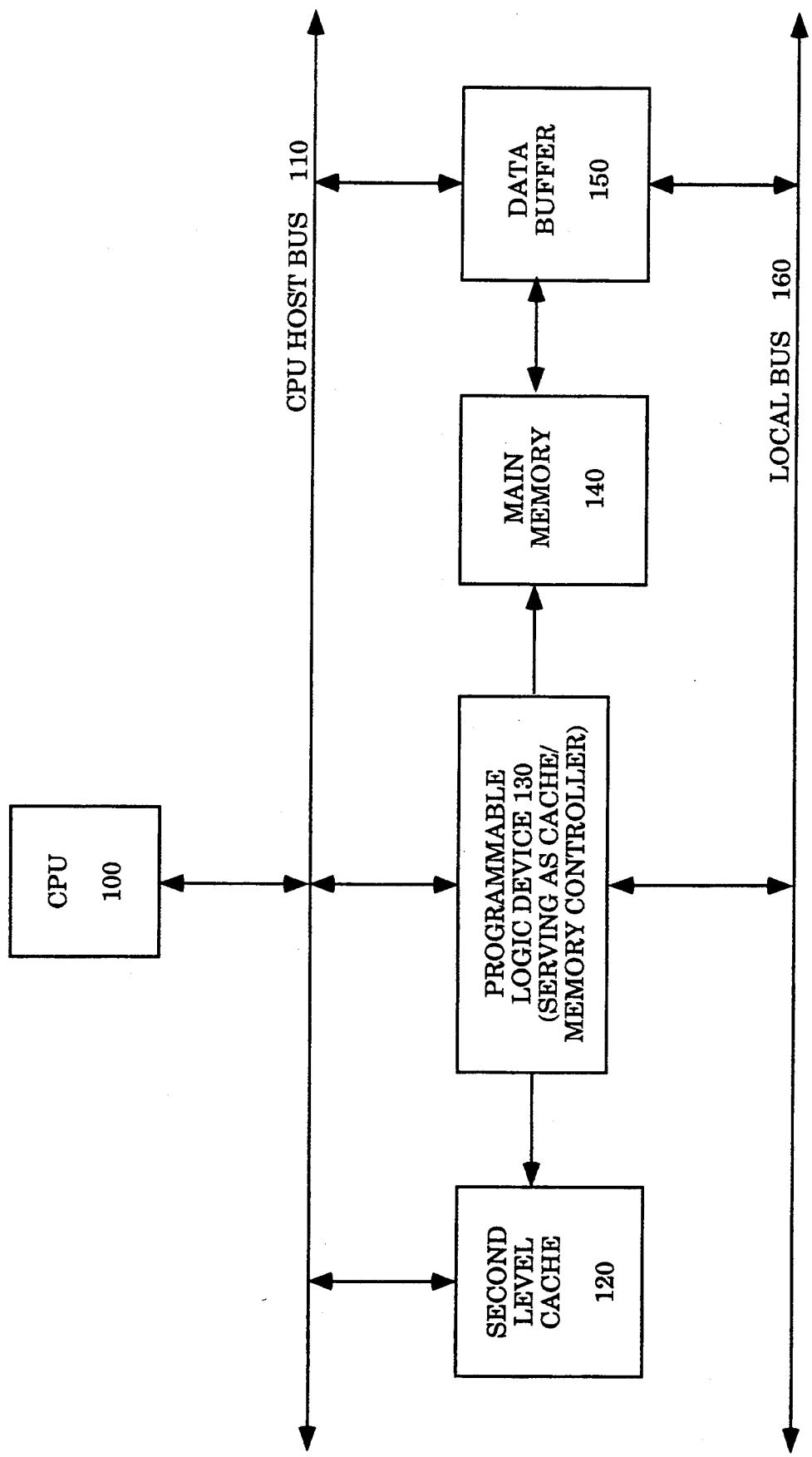
FIG. 7 illustrates the use of the programmable logic device as a cache/memory controller.

It will be appreciated that a programmable logic device incorporating the apparatus and method for selecting polarity and output type of the present invention can be used in a virtually unlimited number of applications. Some of these applications might include, for example, use as a cache/memory controller, bridge or glue logic, look-up table logic, stack or FIFO storage, a scratch pad RAM, initialization PROM, or a micro-sequencer. Two such applications are depicted in FIGS. 7 and 8. While these figures illustrate two advantageous applications for such a programmable logic device (or an FPGA comprising a number of PLD's incorporating the present invention), these figures should not be interpreted in any way as limiting the scope of the present invention.

Referring now to FIG. 7, this figure illustrates the use of the programmable logic device as a cache/memory controller. The system shown includes a CPU 100, a CPU host bus 110, a second level cache memory 120, the programmable logic device of the present invention 130, a main memory 140, for example, comprising DRAM, a data buffer 150, and a local bus 160. As shown, the CPU 100, the second level external cache memory 120, the programmable logic device 130, and the data buffer 150 are all coupled to the CPU host bus 110. In addition, the programmable logic device 130 and the data buffer 150 are also coupled to the local bus 160. In the system shown, the programmable logic device 130 is programmed such that it controls accesses of both the second level cache memory 120 and main memory 140. With reference to FIG. 8, this figure illustrates the use of the programmable logic device 130 as a bridge between the local bus 160 and an electronic component 170 requiring some bridging or glue logic to interface to the local bus 160. In this application, the programmable logic device is advantageously programmed to serve as glue logic.

While the present invention has been particularly described with reference to FIGS. 1 through 8, it should be understood that these figures are for illustration only and should not be taken as limitations upon the invention. It is further contemplated that many changes and modifications may be made to the invention, by one of ordinary skill in the art, without departing from the spirit and scope of the invention as disclosed herein. In particular, as earlier described, the present invention is in no way limited to the described use within a specific field programmable gate array (FPGA), but is instead, readily applicable to virtually any programmable device.

We claim:

1. An apparatus providing for selection of output type and polarity for a sum of product term produced by a programmable logic device, said apparatus comprising:
   a register including a first output enable means, wherein said sum of product term is coupled to said register, and when enabled, said register outputs a registered sum of product term, and a complement of said registered sum of product term;
   a driver including a second output enable means, wherein said sum of product term is coupled to said driver, and when enabled, said driver outputs said sum of product term;
   an inverter including a third output enable means, wherein said sum of product term is coupled to said inverter, and when enabled, said inverter outputs a complement of said sum of product term; and
   an output buffer for selectively outputting one of a group of four signals, said group of four signals comprising said registered sum of product term, said complement of said registered sum of product term, said sum of product term, and said complement of said sum of product term, said output buffer including a polarity select signal, wherein selection of said one of a group of four signals is determined by said first output enable means, said second output enable means and said third output enable means and said polarity select signal, said output buffer coupled to said register, said driver, said inverter and said polarity select signal.

2. The apparatus as claimed in claim 1, wherein said output buffer comprises a plurality of N-channel MOSFET transistors, and a plurality of P-channel MOSFET transistors.

3. The apparatus as claimed in claim 1 wherein said registered sum of product term is selected in response to enabling said first output enable means where said second output enable means and said third output enable means are not enabled and where said polarity select signal is a first predetermined value.

4. The apparatus as claimed in claim 1 wherein said complement of said registered sum of products term is selected in response to enabling said first output enable means where said second output enable means and said third output enable means are not enabled and where said polarity select signal is a second predetermined value.

5. The apparatus as claimed in claim 1 wherein said sum of product term is output in response to enabling said second output enable means where said first output enable means and said third output enable means are not enabled and where said polarity select signal is said first predetermined value.

6. The apparatus as claimed in claim 1 wherein said complement of said sum of product term is output in response to enabling said third output enable means where said first output enable means and said second output enable means are not enabled and where said polarity select signal is said second predetermined value.

7. The apparatus as claimed in claim 1 wherein said output buffer means comprises a plurality of N-channel bipolar transistors, and a plurality of P-channel bipolar transistors.

8. The apparatus as claimed in claim 2 wherein said output buffer comprises:
   a first transistor having a gate, a source, and a drain, wherein said source of said first transistor is coupled to ground;
   a second transistor having a gate, a source, and a drain, wherein said source of said second transistor is coupled to said drain of said first transistor;
   a third transistor having a gate, a source, and a drain, wherein said drain of said third transistor is coupled to said drain of said second transistor;
   a fourth transistor having a gate, a source, and a drain, wherein said drain of said fourth transistor is coupled to said source of said third transistor, and said source of said fourth transistor is coupled to ground;
   a fifth transistor having a gate, a source, and a drain, wherein said source of said fifth transistor is coupled to power;

a sixth transistor having a gate, a source, and a drain, wherein said drain of said sixth transistor is coupled to said drain of said fifth transistor and said drain of said first transistor;

a seventh transistor having a gate, a source, and a drain, wherein said source of said seventh transistor is coupled to said source of said sixth transistor and said drain of said second transistor;

an eighth transistor having a gate, a source, and a drain, wherein said drain of said eighth transistor is coupled to said drain of said seventh transistor and said source of said third transistor, and further wherein said source of said eighth transistor is coupled to power;

means for coupling a sum of product term to the gate of said second transistor;

means for coupling a complement of said sum of product to the gate of said third transistor;

means for coupling a registered sum of product term to the gate of said sixth transistor;

means for coupling a complement of said registered sum of product term to the gate of said seventh transistor;

means for coupling a polarity select signal to the gate of said first transistor and the gate of said fifth transistor;

means for coupling a complement of said polarity select signal to the gate of said fourth transistor and the gate of said eighth transistor;

wherein, through selective enablement of said sum of product term, said complement of said sum of product term, said registered sum of product term, said complement of said registered sum of product term, and said polarity select signal, an output is selectively determined at the source of said seventh transistor.

9. A method providing for selective output of one of a plurality of possible output signals from a programmable logic device, wherein said plurality of possible output signals comprises a registered sum of product term, a complement of said registered sum of product term, a sum of product term, and a complement of said sum of product term, said programmable logic device including an output buffer coupled to an output node of said programmable logic device, said method comprising the steps of:

coupling a plurality of devices to said output buffer, said plurality of devices comprising a register, a driver, and an inverter, said plurality of devices each having an output enable means, said plurality of devices outputting said plurality of possible output signals in response to being enabled by said output enable means;

selectively enabling at least one of said plurality of devices thereby enabling at least one of said plurality of possible output signals;

selectively disabling at least one of said plurality of devices thereby disabling at least one of said plurality of possible output signals; and coupling a polarity select signal to said output buffer, said polarity select signal selectively determining the polarity of said one of said plurality of possible output signals, thereby causing said output buffer to couple one of said plurality of possible output signals to said output node of said programmable logic device.

* * * * *